(12) United States Patent
Watanabe et al.

(10) Patent No.: US 10,283,385 B2
(45) Date of Patent: May 7, 2019

(54) VORTEX PATTERN WET PROCESSING TOOL AND ETCHING METHOD

(71) Applicant: SANDISK TECHNOLOGIES LLC, Plano, TX (US)

(72) Inventors: Takeshi Watanabe, Yokkaichi (JP); Yoshihiro Nagura, Yokkaichi (JP); Kouta Fujikawa, Yokkaichi (JP); Hitoshi Suzuki, Yokkaichi (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 36 days.

(21) Appl. No.: 15/464,617

(22) Filed: Mar. 21, 2017

(65) Prior Publication Data

US 2018/0277378 A1 Sep. 27, 2018

(51) Int. Cl.
*H01L 21/302* (2006.01)
*H01L 21/67* (2006.01)
*H01L 21/3213* (2006.01)
*H01L 21/311* (2006.01)

(52) U.S. Cl.
CPC .... *H01L 21/6708* (2013.01); *H01L 21/32134* (2013.01); *H01L 21/67051* (2013.01); *H01L 21/67075* (2013.01); *H01L 21/67086* (2013.01); *H01L 21/31111* (2013.01)

(58) Field of Classification Search
CPC ......... H01L 21/32134; H01L 21/67075; H01L 21/6708; H01L 21/67051
USPC ........................................ 438/745, 748, 757
See application file for complete search history.

(56) References Cited

U.S. PATENT DOCUMENTS

| 9,502,429 | B2 | 11/2016 | Hironaga |
| 9,515,079 | B2 | 12/2016 | Koka et al. |
| 2016/0013068 | A1* | 1/2016 | Butterbaugh ..... H01L 21/31111 438/748 |
| 2016/0086964 | A1 | 3/2016 | Chien et al. |
| 2016/0148835 | A1 | 5/2016 | Shimabukuro et al. |
| 2017/0053794 | A1* | 2/2017 | Kim ........................ H01L 22/26 |

OTHER PUBLICATIONS

U.S. Appl. No. 15/056,510, filed Feb. 29, 2016, SanDisk Technologies LLC.

* cited by examiner

*Primary Examiner* — Binh X Tran
(74) *Attorney, Agent, or Firm* — The Marbury Law Group, PLLC

(57) ABSTRACT

A wet chemical processing tool is provided, which includes an assembly of a container and at least three nozzles. The container includes a volume configured to contain at least one substrate therein. The wet chemical processing tool includes a flow controller configured to actuate and de-actuate flow of the liquid through each of the at least three nozzles. The flow controller can be operated by an automated program that includes a plurality of wet processing steps. At least two of the plurality of wet processing steps generate a respective unique processing-step vortex flow pattern by de-actuating flow of the liquid from a respective set of at least one deactivated nozzle selected from the at least three nozzles while actuating each of the at least three nozzles that does not belong to the set of at least one deactivated nozzle.

20 Claims, 16 Drawing Sheets

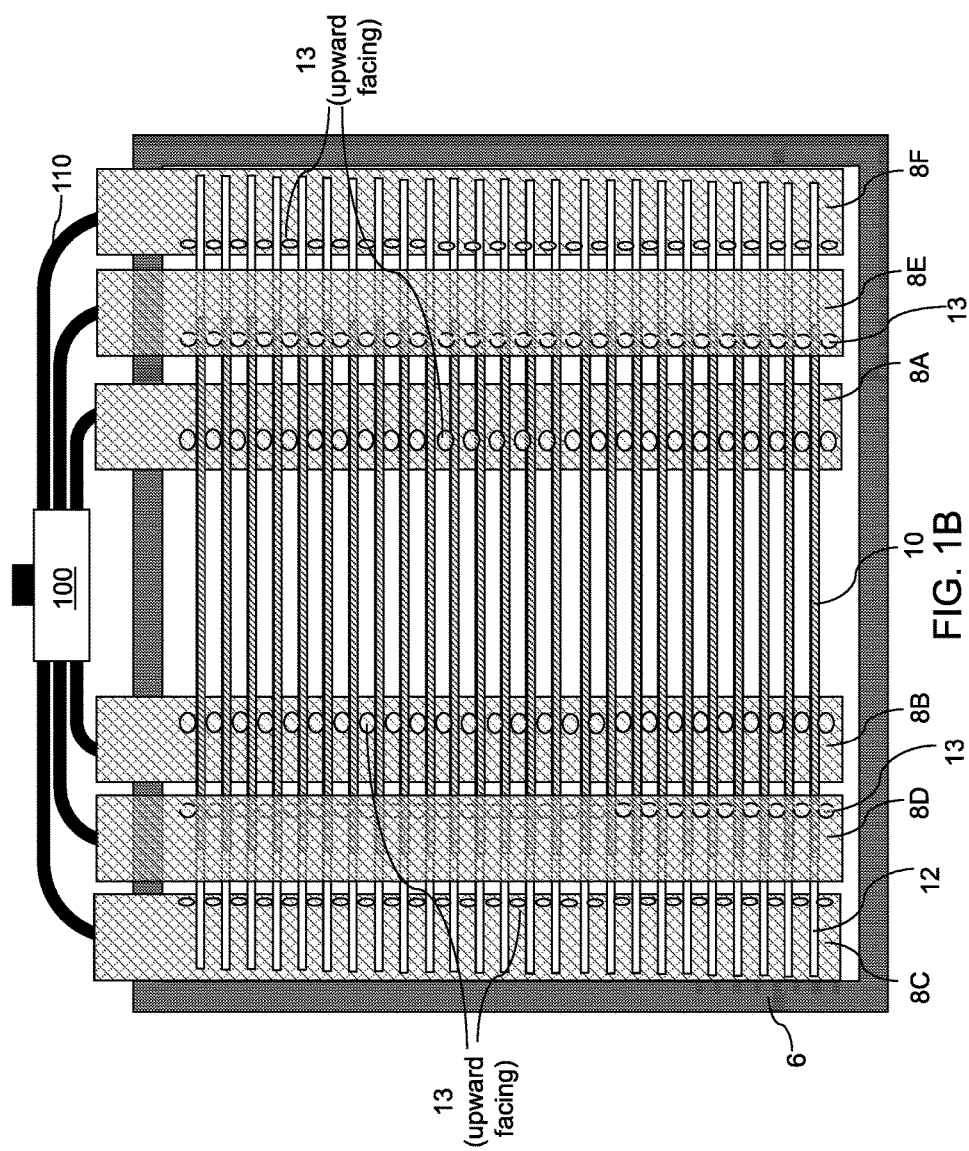

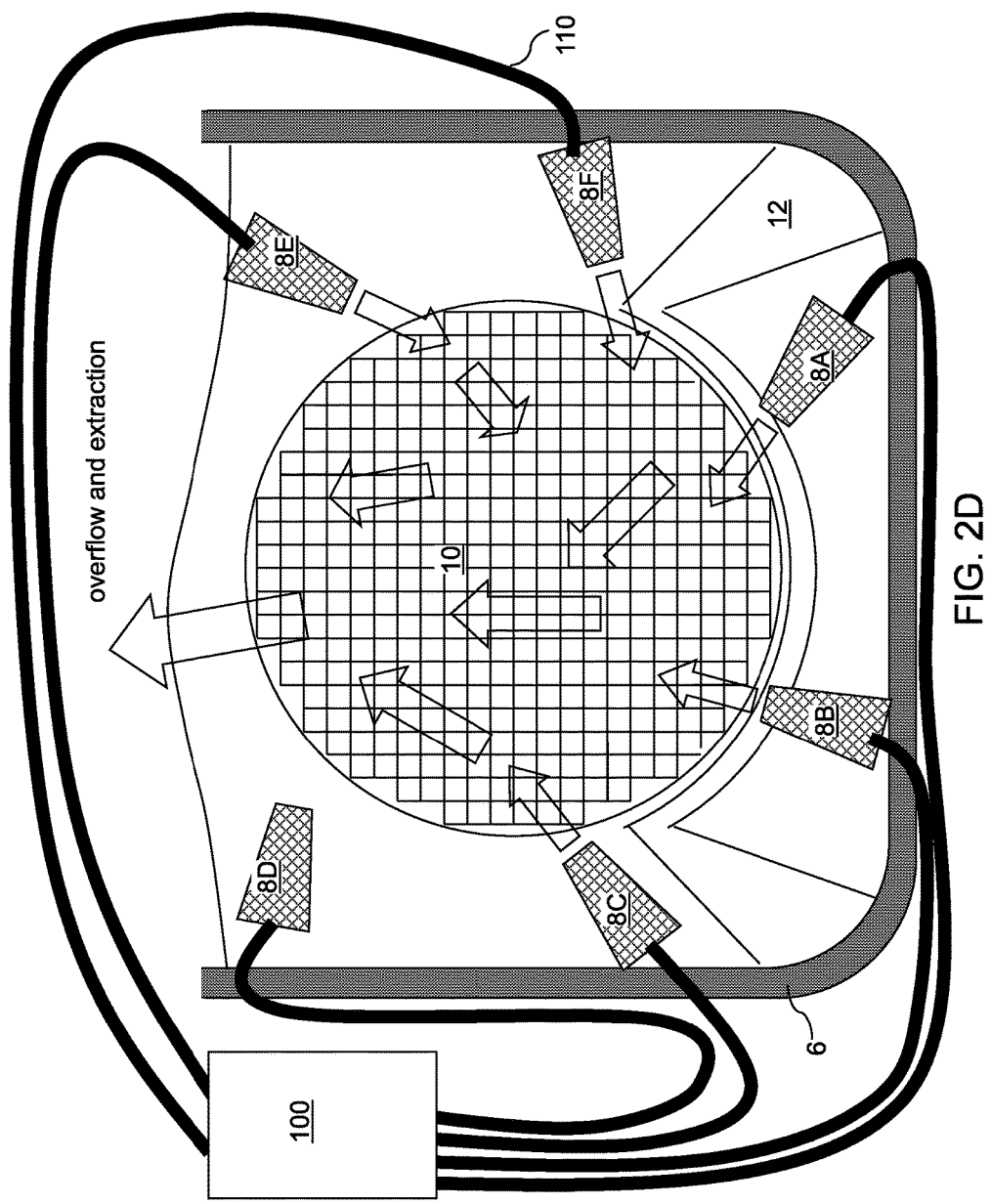

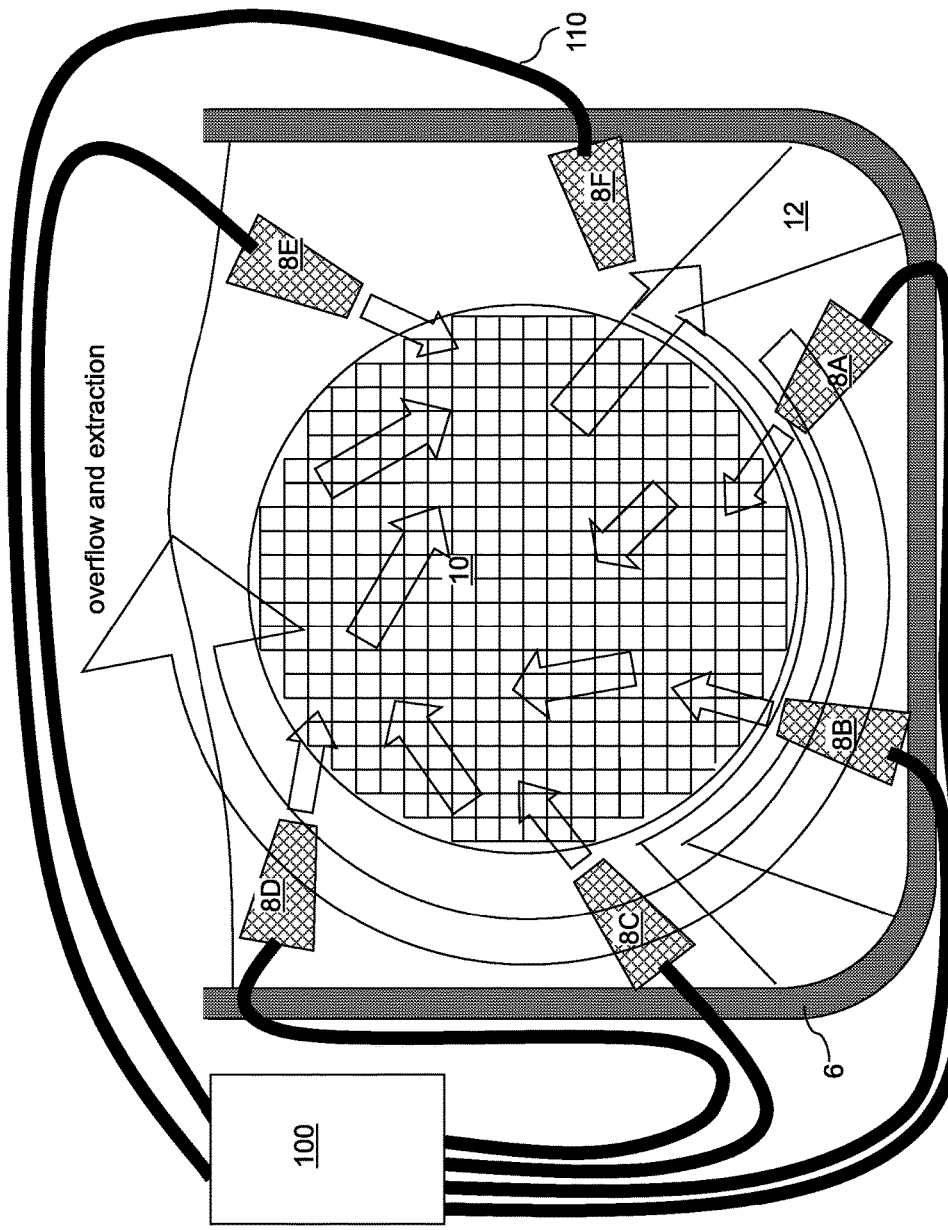

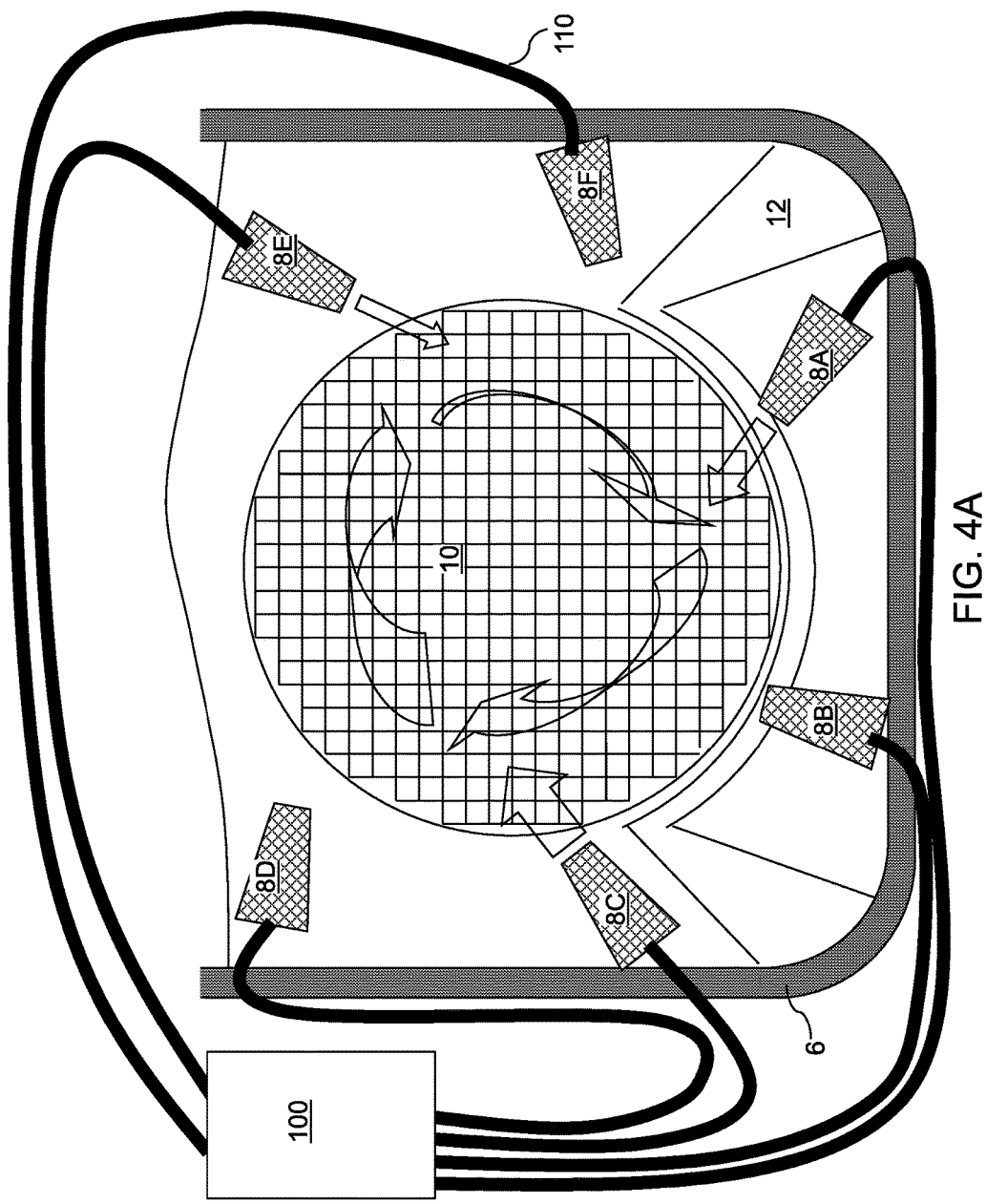

VORTEX PATTERN WET PROCESSING TOOL AND ETCHING METHOD

FIELD

The present disclosure relates generally to the field of semiconductor processing tools, and specifically to a wet processing tool configured to generate multiple vortex patterns of a liquid and methods of operating the same.

BACKGROUND

A wet processing tool, such as a wet etching tool typically includes a container and a nozzle. The nozzle directs an etching liquid onto a surface of a substrate to etch the substrate or one or more layers located on the substrate.

SUMMARY

According to an aspect of the present disclosure, a wet chemical processing tool is provided, which comprises: an assembly of a container and at least three nozzles, wherein the container includes a volume configured to contain at least one substrate therein, wherein each of the at least three nozzles is configured to inject a liquid therefrom toward a respective peripheral portion of the volume to induce a respective single-injection vortex flow pattern, liquid supply tubes configured to provide the liquid to a respective one of the at least three nozzles, and a flow controller configured to actuate and de-actuate flow of the liquid through each of the at least three nozzles in a plurality of wet processing steps. At least one of the plurality of wet processing steps generates a processing-step vortex flow pattern by de-actuating flow of the liquid from a respective set of at least one deactivated nozzle selected from the at least three nozzles while actuating each of the at least three nozzles that does not belong to the set of at least one deactivated nozzle.

In one embodiment, at least two of the plurality of wet processing steps generate a respective unique processing-step vortex flow pattern by de-actuating flow of the liquid from a respective set of at least one deactivated nozzle selected from the at least three nozzles while actuating each of the at least three nozzles that does not belong to the set of at least one deactivated nozzle, wherein each set of at least one deactivated nozzle is different for each of the at least two of the plurality of wet processing steps.

According to another aspect of the present disclosure, a method of treating at least one substrate with a wet chemical is provided. The method comprises loading at least one substrate into a wet chemical processing tool including an assembly of a container and nozzles, activating a first set of the nozzles to inject a liquid from the first set of nozzles toward the at least one substrate to induce a first vortex flow pattern while at least one remaining first nozzle is deactivated, and activating a second set of the nozzles different from the first set of nozzles to inject the liquid from the second set of nozzles toward the at least one substrate to induce a second vortex flow pattern different from the first vortex flow pattern while at least one remaining second nozzle different from the first nozzle is deactivated.

According to another aspect of the present disclosure, a method of treating at least one substrate with a wet chemical is provided. At least one substrate can be loaded into a wet chemical processing tool including an assembly of a container and at least three nozzles, wherein the container includes a volume configured to contain at least one substrate therein, wherein each of the at least three nozzles is configured to inject a liquid therefrom toward a respective peripheral portion of the volume to induce a respective single-injection vortex flow pattern. A plurality of wet processing steps can be performed on the at least one substrate, wherein at least two of the plurality of wet processing steps generate a respective unique processing-step vortex flow pattern by de-actuating flow of the liquid from a respective set of at least one deactivated nozzle selected from the at least three nozzles while actuating each of the at least three nozzles that does not belong to the set of at least one deactivated nozzle, wherein each set of at least one deactivated nozzle is different for each of the at least two of the plurality of wet processing steps.

BRIEF DESCRIPTION OF THE DRAWINGS

FIG. 1B is a top-down view of the exemplary wet chemical processing tool of FIG. 1A.

FIG. 2D is a vertical cross-sectional view of the exemplary wet chemical processing tool during operation while a fourth nozzle is deactivated with schematic illustrations of liquid supply tubes and general liquid flow directions according to an embodiment of the present disclosure.

FIG. 2F is a vertical cross-sectional view of the exemplary wet chemical processing tool during operation while a sixth nozzle is deactivated with schematic illustrations of liquid supply tubes and general liquid flow directions according to an embodiment of the present disclosure.

FIG. 4A is a vertical cross-sectional view of the exemplary wet chemical processing tool during operation while a first triplet of nozzles is activated with schematic illustrations of liquid supply tubes and general liquid flow directions according to an embodiment of the present disclosure.

DETAILED DESCRIPTION

The present inventors realized that process non-uniformity in a wet processing tool can be caused by a flow pattern of a liquid in the wet processing tool. Of particular concern is a stagnant region or a slow flow region in which flow of the liquid is stagnant or slow. For example, stagnation of hot phosphoric acid used for etching silicon nitride in a wet etch tank can cause deposition of silicon oxide on a surface of a substrate under processing. Thus, a wet processing tool that can avoid the effects of a stagnant region and/or a slow flow region is desired. Embodiments of the present disclosure are directed to a wet processing tool (e.g., wet etching apparatus) configured to generate one or multiple vortex patterns of a liquid and methods of operating the same, the various aspects of which are described below. The embodiments of the disclosure can be employed to form various semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise.

Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, an "in-process" structure or a "transient" structure refers to a structure that is subsequently modified.

Figure 1A:
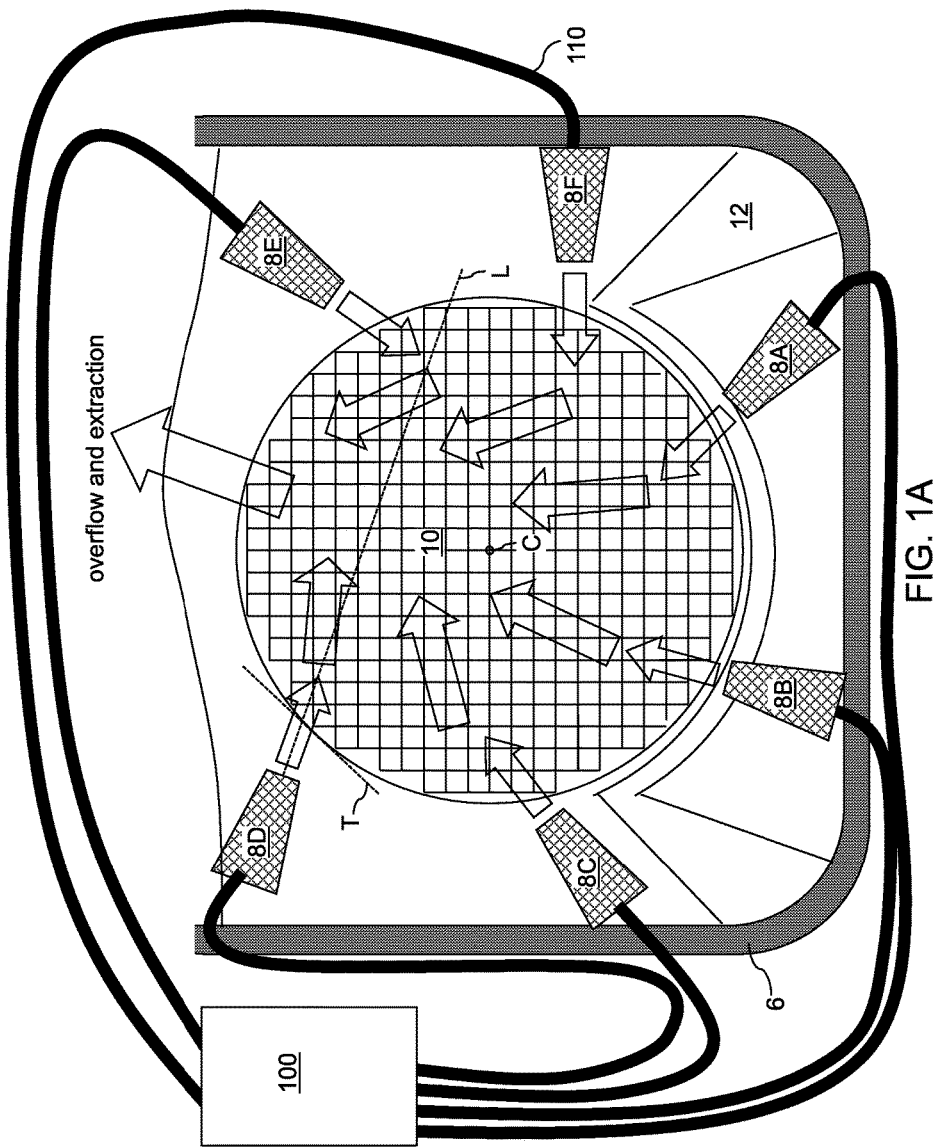
FIG. 1A is a schematic vertical cross-sectional view of an exemplary wet chemical processing tool during operation while all nozzles are activated with schematic illustrations of liquid supply tubes and general liquid flow directions according to an embodiment of the present disclosure.
Figure 1C:
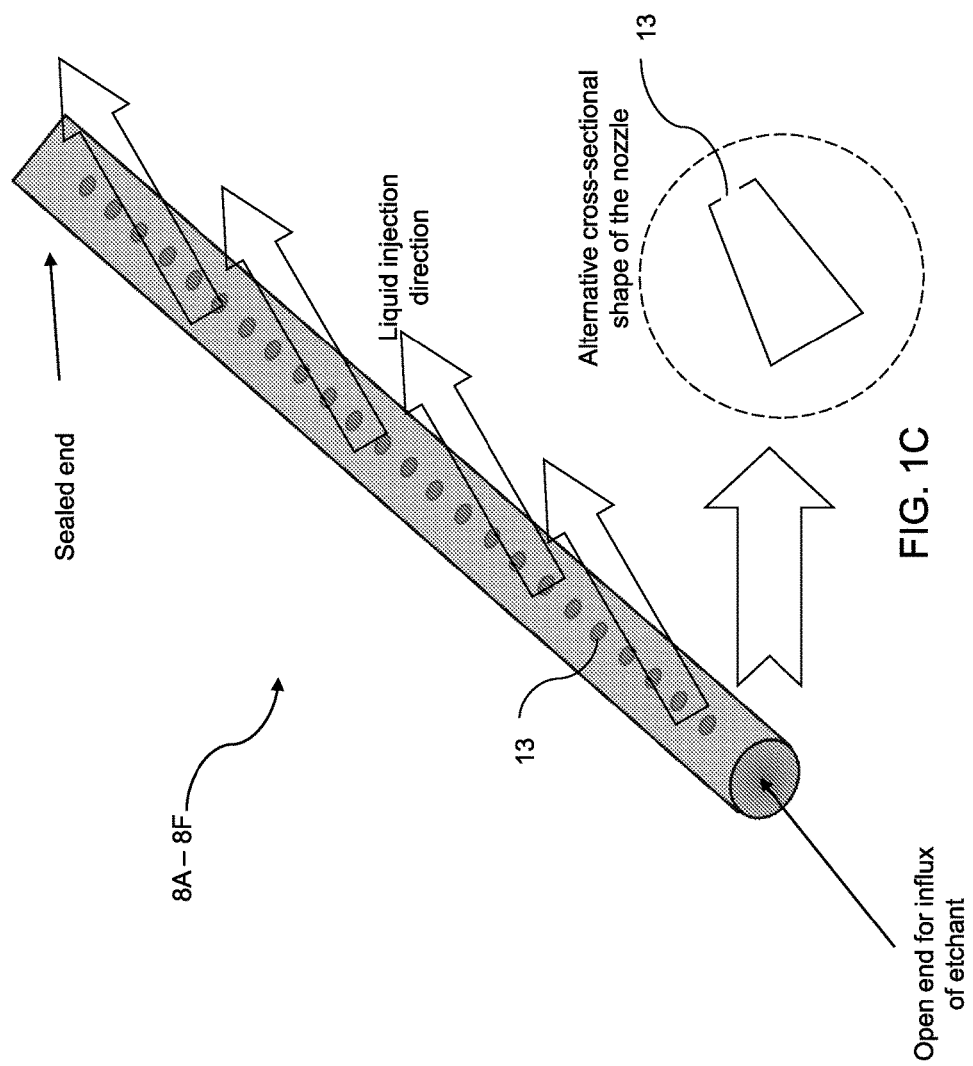
FIG. 1C is a perspective view of a nozzle of the present disclosure.

Referring to FIGS. 1A-1C, an exemplary wet chemical processing tool according to an embodiment of the present disclosure is illustrated during operation while all nozzles (8A-8F) are activated. The exemplary wet chemical processing tool includes an assembly of a container 6 and at least three nozzles (8A-8F). The exemplary wet chemical processing tool of FIGS. 1A and 1B is provided with a set of six nozzles (8A-8F). The six nozzles are labeled as first, second, third, fourth, fifth, and sixth nozzles (8A-8F) along a clockwise direction starting with a nozzle in the lower right side of FIG. 1A. While the present disclosure is described employing a configuration in which six nozzles (8A-8F) are provided, embodiments are expressly contemplated herein in which three, four, five, or more than six nozzles are employed. As such, the description of the embodiments of the present disclosure encompasses each configuration in which the total number of nozzles is three, four, five, six, or greater than six.

Each of the at least three nozzles (8A-8F) is provided with a respective liquid supply tube 110. The liquid supply tubes 110 are configured to provide the liquid to a respective one of the at least three nozzles (8A-8F), and may comprise flexible tubes and/or inflexible tubes. The liquid supply tubes 110 are connected to a flow controller 100, which controls the flow of the liquid through the liquid supply tubes. For example, the flow controller 100 can be provided with as many mass flow controllers or as many flow switches as the number of the nozzles (8A-8F) provided within the container 6.

The container 6 includes a volume configured to contain at least one substrate 10 therein. In one embodiment, the container 6 can include at least one substrate holder 12, which can be configured to physically support and hold a plurality of substrate 10 with gaps thereamongst. The plurality of substrates 10 can be semiconductor substrates, such as silicon wafers or other semiconductor wafers known in the art, and can have a diameter, for example, in a range from 125 mm, 150 mm, 200 mm, 300 mm, or 450 mm. In one embodiment, the substrate holder 12 can be configured to hold one "lot" of wafers, which typically includes 25 wafers or more. The container 6 can be in a bowl configuration that allows overflow of the liquid from a rim of the container 6, or can be provided with a cover which, in conjunction with a body of the container 6, can seal a volume inside upon closing the cover and activating a suitable sealing mechanism. The material of the container 6 can be selected to withstand the chemical effects of the liquid therein, which may comprise an etching liquid, such as an acid solution, a base solution, or any other chemical suitable for the wet chemical processing (e.g., wet etching) to be performed on the at least one substrate 10. For example, the liquid may be an acid such as hot phosphoric acid.

Each of the at least three nozzles (8A-8F) can be configured to inject a liquid therefrom toward a respective peripheral portion of the volume for holding the at least one substrate 10. The direction of injection from each nozzle (8A-8F) can be off-centered from the geometrical center of the volume such that injection of the liquid from any single nozzle (8A-8F) while other nozzles (8A-8F) are inactive induces a rotating flow around a surface of the substrate 10, such as a respective single-injection vortex flow pattern. In this case, an imaginary straight line "L" from the liquid output from outlets 13 of each nozzle does not cross the geometrical center of the volume "C" on the line "L" when they are projected in the same vertical plane, as shown in FIG. 1A. Point "C" is located above the substrate holder 12 at the geometrical center of the substrate (e.g., silicon wafer) 10. In other words, line "L" from a respective nozzle is not perpendicular to a line "T" tangent to the edge of the substrate facing the respective nozzle. For example, line "L" may be inclined at an angle of 50 to 85 degrees, such as 60 to 75 degrees with respect to line "T" for each nozzle.

As used herein, a "flow pattern" refers to a pattern of a liquid that flows within a confined volume such as the volume of the container. As used herein, a "vortex flow pattern" refers to a flow pattern that includes a vortex therein, i.e., a region of a non-zero curl in the vector field defined by the average velocity of the liquid in a volume. As used herein, a "single-injection vortex flow pattern" refers to a vortex flow pattern induced by injection of a liquid only from a single nozzle.

The liquid rotates generally around an axial direction that is perpendicular to the direction of injection from the respective nozzle (8A-8F) within each single-injection vortex flow pattern. The direction of injection can be within a respective two-dimensional plane that is parallel to the major surfaces of the at least one substrate 10. Thus, the axial direction can be perpendicular to the two-dimensional planes including the major surfaces of the at least one substrate 10. For example, the at least one substrate 10 can be a semiconductor wafer having a substantially circular disc shape with a wafer flat on one edge (e.g., the top edge in FIG. 1A). This substrate 10 has a respective substantially circular front surface and a respective substantially circular back surface, the axial direction can be perpendicular to the front side surface(s) and the back side surface(s) of the at least one substrate 10. In FIG. 1A, the substantially circular front surface(s) and the substantially circular back surface(s) can be parallel to the plane including the drawings of FIG. 1A, and the axial direction can be perpendicular to the plane including the drawings of FIG. 1A. In one embodiment, the outlets of each nozzle (8A-8F) can be arranged as a linear array of openings 13 that extend along an axial direction of the substrates 10 that is perpendicular to major surfaces of the substrates 10, as shown in FIGS. 1B and 1C.

Each single-injection vortex flow pattern is different for the respective nozzles (8A-8F). Each of the single-injection vortex flow pattern can have a generally same rotation direction for the liquid with respect to a hypothetical axis that passes the geometrical centers of a plurality of substrates 10 that are loaded into the volume of the container 6. In other words, when seen from a direction that is perpendicular to the planes of the major surfaces of the plurality of substrates 10 (such as the substantially circular top surfaces or the substantially circular bottom surfaces in case the substrates 10 have shapes of substantially circular discs), the entire set of vortex flow patterns caused by single injection from any one of the nozzles (8A-8F) are clockwise patterns, or the entire set of vortex flow patterns caused by single injection from any one of the nozzles (8A-8F) are counter-clockwise patterns. Each nozzle (8A-8F) can comprise a respective conduit, such as a pipe or tube, including at least one outlet 13 for the liquid injection. The cross-sectional shape of the pipe or tube may be circular or non-circular. In case the pipe or tube has a non-circular cross-sectional shape as shown in the inset of FIG. 1C, the outlets 13 may be provided on the narrow side of the tube to increase the directionality of the injected liquid. In case the pipe or tube comprises a cylindrical pipe having an open end and a closed end and having a circular cross sectional shape, then the outlets 13 may be openings arranged along the length of the pipe. The at least one outlet 13 may be a plurality of discrete outlets (e.g., openings or holes in a pipe or tube), or may be one or more elongated slits.

In one embodiment, there may be one outlet 13 corresponding to each substrate 10 position on the substrate holder 12. The at least one substrate holder 12 can be configured to hold a plurality of substrates 10 with an inter-substrate pitch. Each of the at least three nozzles (8A-8F) can comprise an array of outlets 13 arranged along the direction of the inter-substrate pitch (which can be perpendicular to the major surfaces of the substrate 10). The outlets 13 can have an inter-outlet pitch that is the same as the inter-substrate pitch. In one embodiment, the outlets 13 can be positioned between each neighboring pair of major surfaces of the substrate 10. As used herein, a major surface of a substrate refers to a surface that includes more than 25% of the total physically exposed surfaces of the substrate.

The flow controller 100 is configured to actuate and de-actuate flow of the liquid through each of the at least three nozzles (8A-8F) by allowing or preventing the flow of the liquid either at each of the at least three nozzles (8A-8F) or at the flow controller 100. The flow controller 100 can be provided with at least one automated program that comprises a plurality of wet processing steps (e.g., wet etching steps). A microprocessor for controlling each of the at least one automated program can be provided within the flow controller 100, and/or can be provided within an external computer (not shown) that is configured to control the operation of the flow controller 100 remotely. In one embodiment, the flow controller 100 comprises a processor and a memory unit in communication with the processor. The memory unit can be configured to store the at least one automated program, and may be configured to store a plurality of automated programs. The processor can be configured to execute one of the at least one automated program and to provide signals to each of the at least three nozzles to actuate or de-actuate flow of the liquid through each of the at least three nozzles according to the selected automated program under execution.

Referring to FIGS. 2A-2F, at least two of the plurality of wet processing steps in the automated program generate a respective unique processing-step vortex flow pattern by de-actuating flow of the liquid from a respective set of at least one deactivated nozzle (8A-8F) selected from the at least three nozzles (8A-8F) while actuating each of the remaining at least three nozzles that does not belong to the set of at least one deactivated nozzle. In other words, the automated program includes two or more wet processing steps each of which has a corresponding processing-step vortex flow pattern. As used herein, a "processing-step vortex flow pattern" refers to a vortex flow pattern employed at a processing step. As used herein, a nozzle is "activated" if flow of the liquid through the nozzle is enabled, for example, by opening valves that control the flow of the liquid through the nozzle. As used herein, a nozzle is "deactivated" if flow of the liquid through the nozzle is disabled, for example, by closing valves that control the flow of the liquid through the nozzle.

The processing-step vortex flow patterns of the two or more processing steps are different among one another. In other words, the vector field representing the velocity of the fluid at various locations within the container 6 and not occupied by the at least one substrate 10 are different for each of the processing-step vortex flow patterns. Further, the locations of the center of rotation (i.e., the center of the vortex pattern at which the liquid is stationary) can be different for each of the at least two of the plurality of wet processing steps in the automated program. Each nozzle (8A-8F) that is not activated is deactivated. Each set of at least one deactivated nozzle in the at least two of the plurality of wet processing steps in the automated program can be different.

Figure 2A:
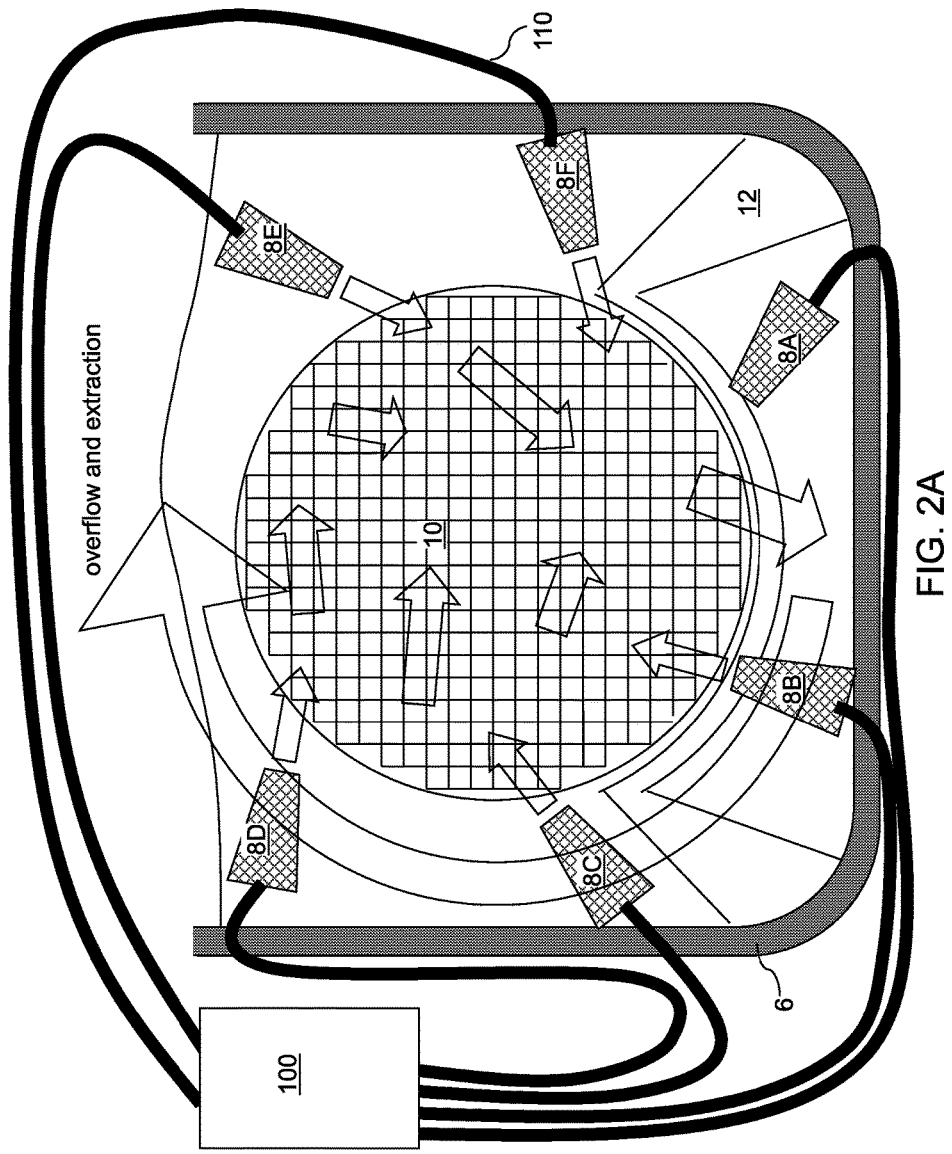
FIG. 2A is a vertical cross-sectional view of the exemplary wet chemical processing tool during operation while a first nozzle is deactivated with schematic illustrations of liquid supply tubes and general liquid flow directions according to an embodiment of the present disclosure.
Figure 2B:
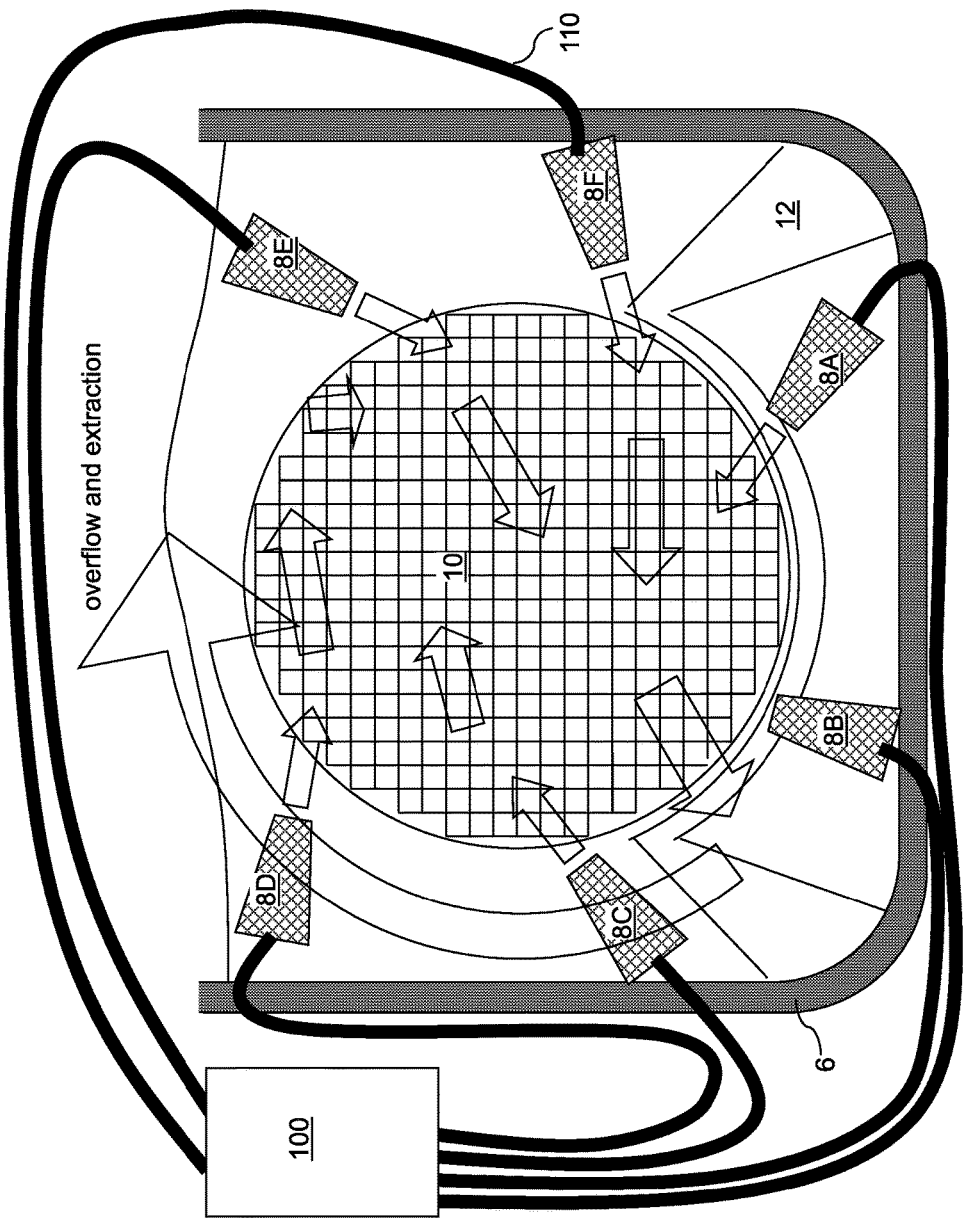
FIG. 2B is a vertical cross-sectional view of the exemplary wet chemical processing tool during operation while a second nozzle is deactivated with schematic illustrations of liquid supply tubes and general liquid flow directions according to an embodiment of the present disclosure.
Figure 2C:
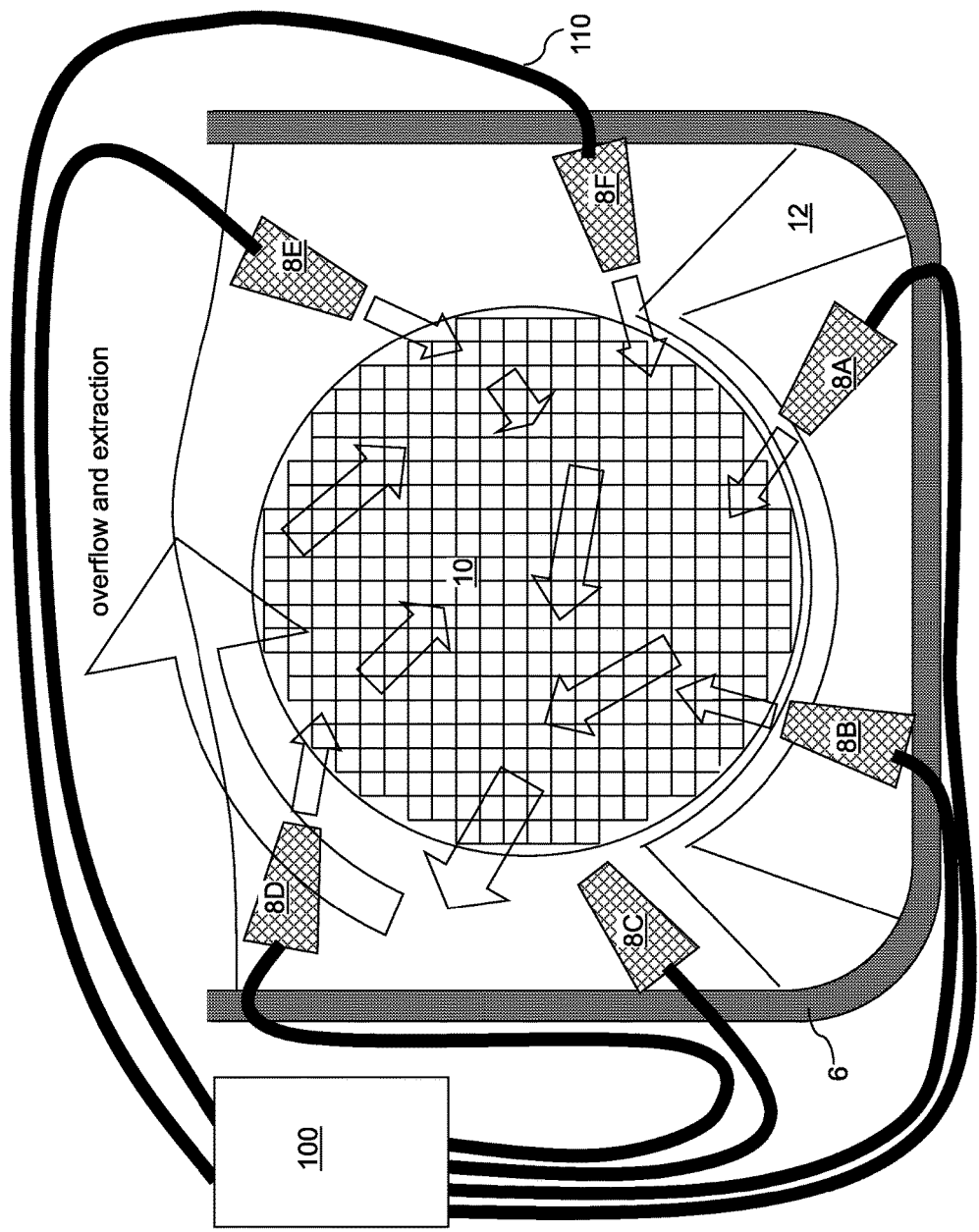
FIG. 2C is a vertical cross-sectional view of the exemplary wet chemical processing tool during operation while a third nozzle is deactivated with schematic illustrations of liquid supply tubes and general liquid flow directions according to an embodiment of the present disclosure.
Figure 2E:
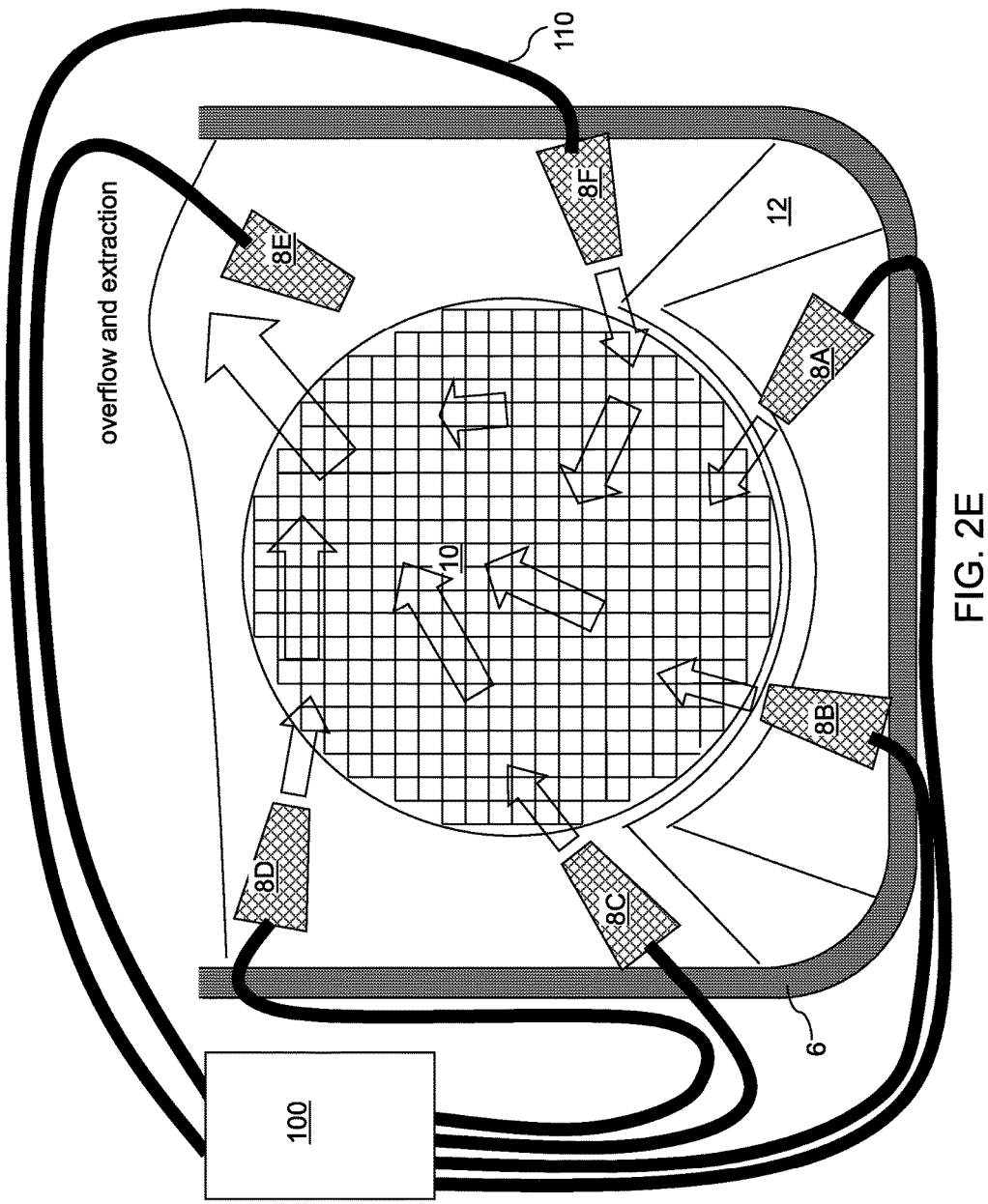
FIG. 2E is a vertical cross-sectional view of the exemplary wet chemical processing tool during operation while a fifth nozzle is deactivated with schematic illustrations of liquid supply tubes and general liquid flow directions according to an embodiment of the present disclosure.

Each of FIGS. 2A-2F illustrate a processing-step vortex flow pattern that is different from other processing-step vortex flow patterns. FIG. 2A illustrates a first processing-step vortex flow pattern generated by employing five actuated nozzles (which include at least two actuated nozzles) including a second nozzle 8B, a third nozzle 8C, a fourth nozzle 8D, a fifth nozzle 8E, and a sixth nozzle 8F, while de-actuating a first nozzle 8A. FIG. 2B illustrates a second processing-step vortex flow pattern generated by employing five actuated nozzles (which include at least two actuated nozzles) including the first nozzle 8A, the third nozzle 8C, the fourth nozzle 8D, the fifth nozzle 8E, and the sixth nozzle 8F, while de-actuating the second nozzle 8B. FIG. 2C illustrates a third processing-step vortex flow pattern generated by employing five actuated nozzles (which include at least two actuated nozzles) including the first nozzle 8A, the second nozzle 8B, the fourth nozzle 8D, the fifth nozzle 8E, and the sixth nozzle 8F, while de-actuating the third nozzle 8C. FIG. 2D illustrates a fourth processing-step vortex flow pattern generated by employing five actuated nozzles (which include at least two actuated nozzles) including the first nozzle 8A, the second nozzle 8B, the third nozzle 8C, the fifth nozzle 8E, and the sixth nozzle 8F, while de-actuating the fourth nozzle 8D. FIG. 2E illustrates a fifth processing-step vortex flow pattern generated by employing five actuated nozzles (which include at least two actuated nozzles) including the first nozzle 8A, the second nozzle 8B, the third nozzle 8C, the fourth nozzle 8D, and the sixth nozzle 8F, while de-actuating the fifth nozzle 8E. FIG. 2F illustrates a sixth processing-step vortex flow pattern generated by employing five actuated nozzles (which include at least two actuated nozzles) including the first nozzle 8A, the second nozzle 8B, the third nozzle 8C, the fourth nozzle 8D, and the fifth nozzle 8E, while de-actuating the fifth nozzle 8F.

Each of the first through sixth processing-step vortex flow patterns are distinct among one another, and may have different stationary flow spots. The automated program can employ at least two of the first through sixth processing-step vortex flow patterns during processing of a set of at least one substrate 10. In one embodiment, the automated program can include at least three of the first through sixth processing-step vortex flow patterns during processing of a set of at least one substrate 10. In one embodiment, the automated program can employ at least four of the first through sixth processing-step vortex flow patterns during processing of a set of at least one substrate 10. In one embodiment, the automated program can employ at least five of the first through sixth processing-step vortex flow patterns during processing of a set of at least one substrate 10. In one embodiment, the automated program can employ each the first through sixth processing-step vortex flow patterns during processing of a set of at least one substrate 10.

Each of the at least two of the first through sixth processing-step vortex flow patterns may be performed once during the automated program, or may be performed multiple times during an automated program.

Within the processing-step vortex flow patterns of FIGS. 2A-F, only a respective single nozzle among the at least three nozzles (8A-8F) of the wet chemical processing tool of the present disclosure is deactivated, while all other nozzles among the at least three nozzles (8A-8F) are activated in each wet processing step among the at least two of the plurality of wet processing steps. The respective deactivated single nozzle is different for each wet processing step among the at least two of the plurality of wet processing steps.

While FIGS. 2A-2F illustrate processing-step vortex flow patterns derived from a total of six nozzles (8A-8F) that includes one de-actuated nozzle and five actuated nozzles, additional processing step vortex flow patterns can be generated by actuating less than five nozzles out of a total of six nozzles of the wet chemical processing tool.

Figure 3A:
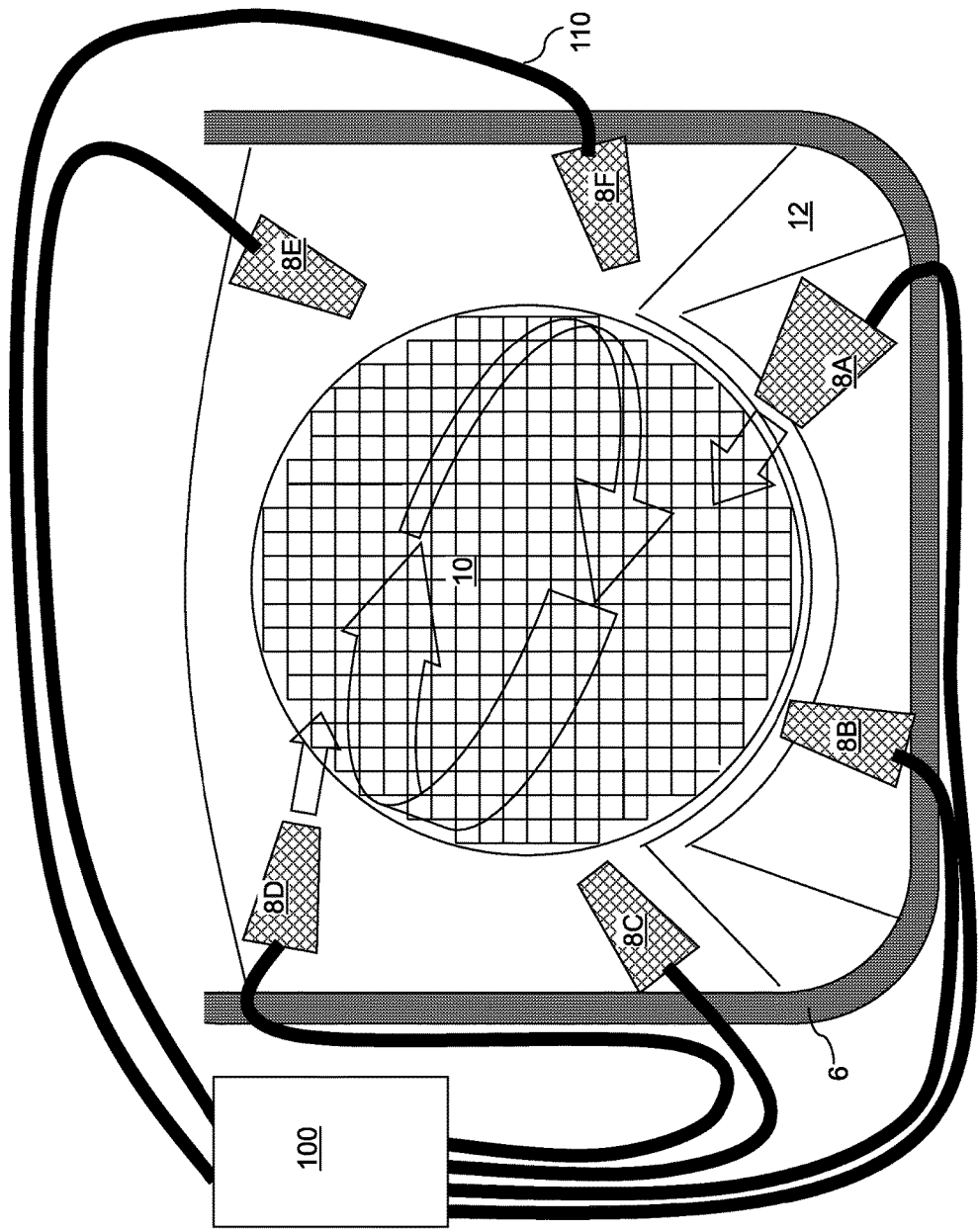
FIG. 3A is a vertical cross-sectional view of the exemplary wet chemical processing tool during operation while a first pair of nozzles is activated with schematic illustrations of liquid supply tubes and general liquid flow directions according to an embodiment of the present disclosure.
Figure 3B:
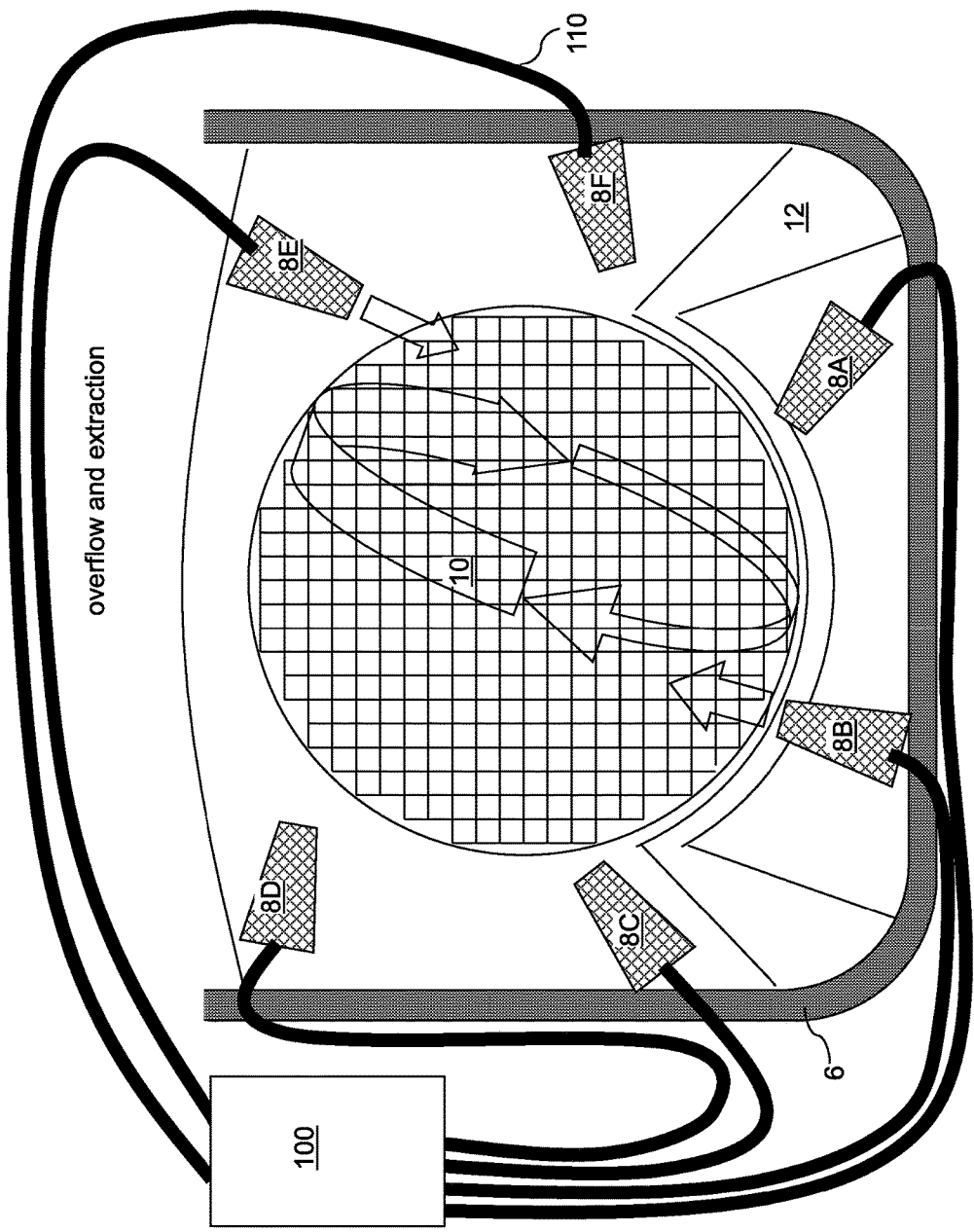
FIG. 3B is a vertical cross-sectional view of the exemplary wet chemical processing tool during operation while a second pair of nozzles is activated with schematic illustrations of liquid supply tubes and general liquid flow directions according to an embodiment of the present disclosure.
Figure 3C:
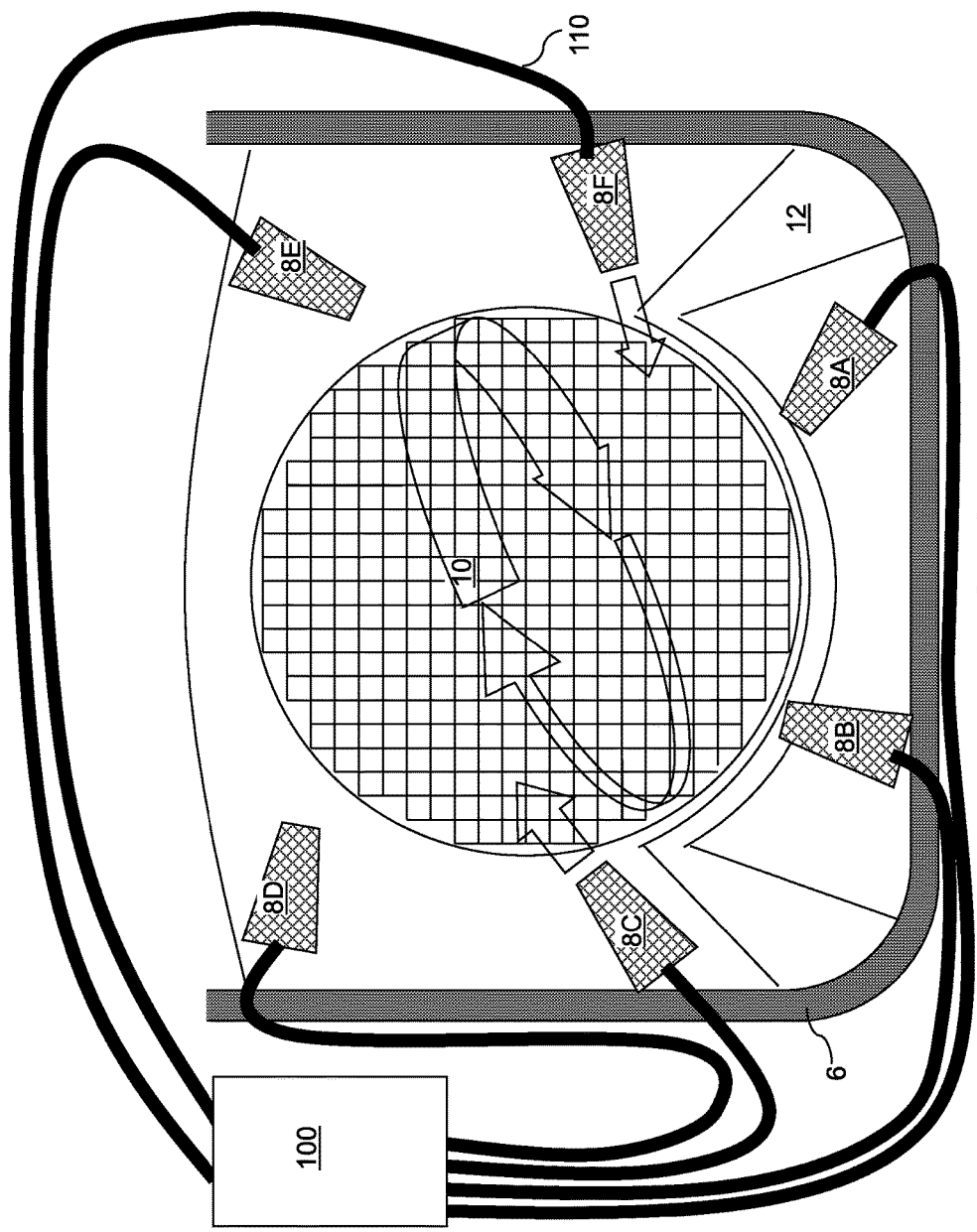
FIG. 3C is a vertical cross-sectional view of the exemplary wet chemical processing tool during operation while a third pair of nozzles is activated with schematic illustrations of liquid supply tubes and general liquid flow directions according to an embodiment of the present disclosure.

FIGS. 3A-3C illustrate additional processing-step vortex flow patterns in which two nozzles out of six nozzles are actuated and the remaining four nozzles are de-actuated. In the processing-step vortex flow pattern of FIG. 3A, a first pair of nozzles including the first nozzle 8A and the fourth nozzle 8D is activated, while the remaining nozzles (8B, 8C, 8E, 8F) are deactivated. In the processing-step vortex flow pattern of FIG. 3B, a second pair of nozzles including the second nozzle 8B and the fifth nozzle 8E is activated, while the remaining nozzles (8A, 8C, 8D, 8F) are deactivated. In the processing-step vortex flow pattern of FIG. 3C, a third pair of nozzles including the third nozzle 8C and the sixth nozzle 8F is activated, while the remaining nozzles (8B, 8C, 8E, 8F) are deactivated. General liquid flow directions are illustrated by arrows in FIGS. 3A-3C.

In one embodiment, each nozzle among the at least three nozzles (8A-8F) can be configured to provide the same flow rate or substantially same flow rate. As used herein, flow rates are "substantially" the same if the flow rates do not deviate from their average by more than 10%. Alternatively, the flow rates of the at least three nozzles may be different (e.g., different by more than 10%, such as 20% to 200%) among one another to compensate for the effects of the geometry of the container 6 and/or the at least one substrate 10. For example, flow rates for nozzles located near the bottom of the container 6 or injecting liquid toward the top of the container can be higher than flow rates for nozzles located near an interface between the liquid and the ambient (which may be air or a controlled gaseous environment) to reduce variation of the local maximum flow rates across the volume within the container 10. For example, as shown in FIG. 3A, the flow rate (shown by a thicker arrow) from the lower nozzle 8A is higher than the flow rate from the opposing upper nozzle 8D (shown by a thinner arrow) that are activated together as a pair. In one embodiment, opposing nozzles (e.g., 8A and 8D, 8B and 8E, 8C and 8F) may be activated in pairs in this embodiment.

Figure 4B:
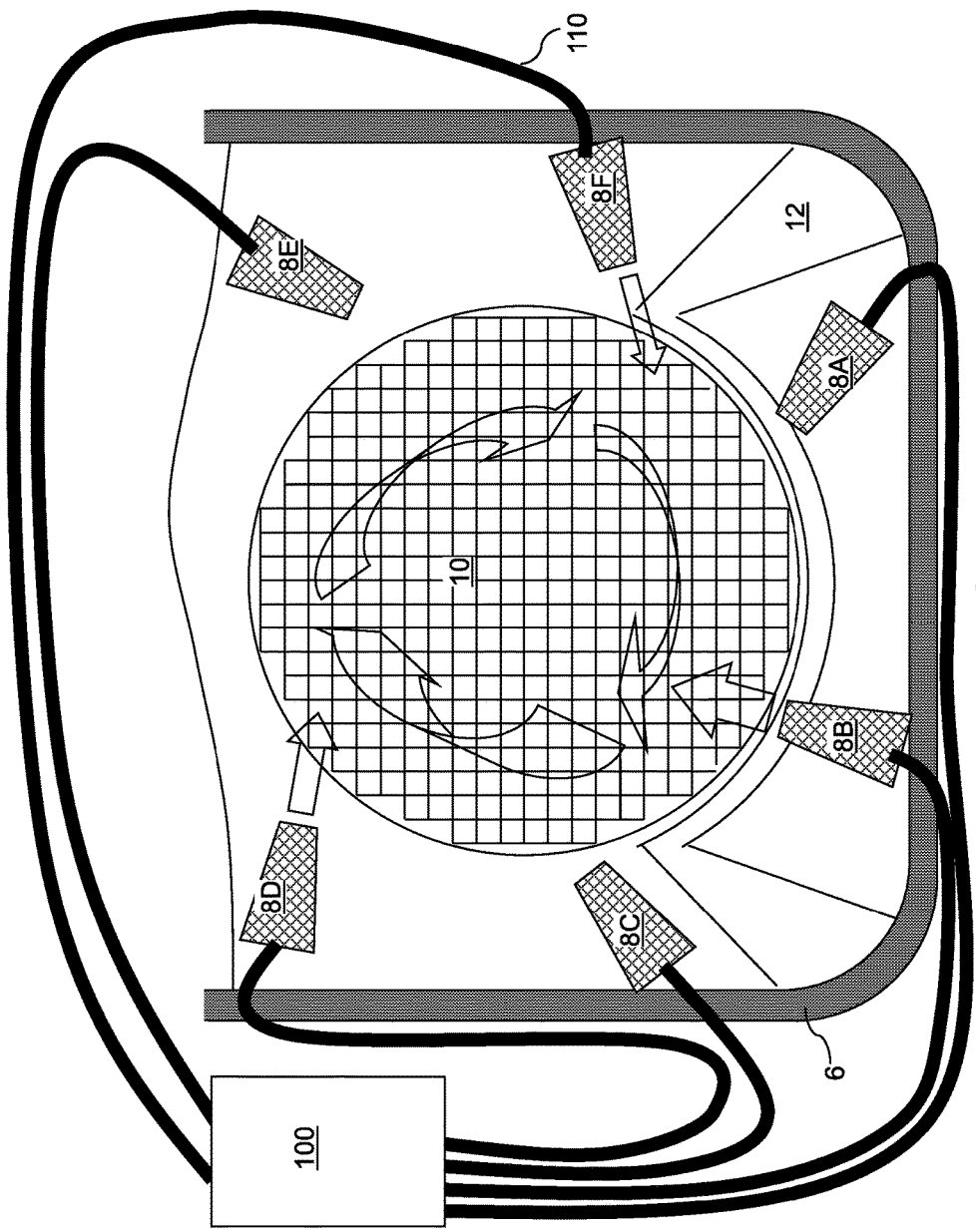
FIG. 4B is a vertical cross-sectional view of the exemplary wet chemical processing tool during operation while a second triplet of nozzles is activated with schematic illustrations of liquid supply tubes and general liquid flow directions according to an embodiment of the present disclosure.

FIGS. 4A and 4B illustrate additional processing-step vortex flow patterns in which three nozzles out of six nozzles are actuated and the remaining three nozzles are de-actuated. In the processing-step vortex flow pattern of FIG. 4A, a first triplet of nozzles including the first nozzle 8A, the third nozzle 8C, and the fifth nozzle is activated, while the remaining nozzles (8B, 8D, 8F) are deactivated. In the processing-step vortex flow pattern of FIG. 4B, a second triplet of nozzles including the second nozzle 8B, the fourth nozzle 8D, and the sixth nozzle 8F is activated, while the remaining nozzles (8A, 8C, 8E) are deactivated. For example, as shown in FIG. 4B, the flow rate (shown by a thicker arrow) from the lower nozzle 8B is higher than the flow rate from the upper nozzle 8D, and the flow rate from the upper nozzle 8D is higher than the flow rate from the middle nozzle 8F (shown by a thinner arrow) that are activated together as a triplet. Alternatively, as shown in FIG. 4A, the middle nozzle may have the highest flow rate and the upper nozzle may have the lowest flow rate. In one embodiment, alternating nozzles may be activated as triplets in this embodiment.

The processing-step vortex flow patterns illustrated in FIGS. 2A-2F, 3A-3C, 4A, and 4B are only illustrative, and additional processing-step vortex flow patterns can be generated by actuating at least one, but not all, of the at least three nozzles (8A-8F) provided in the wet chemical processing tool. At least one nozzle among the at least three nozzles (8A-8C) is de-actuated in each of the processing-step vortex flow patterns. At least one automated program includes one or more of such processing-step vortex flow patterns, i.e., one or more processing-step vortex flow patterns in which at least one, but not all, of the at least three nozzles (8A-8F) provided in the wet chemical processing tool is actuated, while the set of remaining at least one nozzle remains de-actuated.

In some embodiments, the at least three nozzles (8A-8F) of the wet chemical processing tool of the present disclosure can comprise at least four nozzles (8A-8F). In this case, the plurality of wet processing steps in an automated program can include at least one wet processing step in which two or more nozzles among the at least four nozzles (8A-8F) are actuated. For example, each of the processing-step vortex flow patterns illustrated in FIGS. 2A-2F, 3A-3C, 4A, and 4B has the characteristic that two or more nozzles among the at least four nozzles (8A-8F) are actuated to generate the respective processing-step vortex flow pattern while at least one nozzle among the at least four nozzles (8A-8F) remains de-actuated.

In some embodiments, two or more nozzles among the at least four nozzles (8A-8F) can be deactivated in each of the at least one wet processing step of the automated program. For example, each of the processing-step vortex flow patterns illustrated in FIGS. 3A-3C, 4A, and 4B has the characteristic that two or more nozzles among the at least four nozzles (8A-8F) are deactivated, while a remaining set of nozzles that include two or more nozzles is actuated.

In some embodiments, the at least three nozzles (8A-8F) comprise at least five nozzles, a respective set of two nozzles among the at least five nozzles (8A-8F) is activated while all nozzles other than the respective set of two nozzles are deactivated in each of the at least two wet processing step among the plurality of wet processing steps. The respective set of two nozzles is different for each wet processing step among the at least two of the plurality of wet processing steps. For example, each of the processing-step vortex flow patterns illustrated in FIGS. 3A-3C has the characteristic that a respective set of two nozzles among the six nozzles (8A-8F) is activated while all nozzles other than the respective set of two nozzles are deactivated. An automated program for the exemplary wet chemical processing tool can include wet processing steps in which two or more of the processing-step vortex flow patterns of FIGS. 3A-3C are employed. The set of two activated nozzles is different for each processing-step vortex flow patterns illustrated in FIGS. 3A-3C.

In some embodiments, the at least three nozzles (8A-8F) can comprise at least four nozzles, two or more nozzles among the at least four nozzles can be deactivated in each of the at least one wet processing step within the automated program. For example, each of the processing-step vortex flow patterns illustrated in FIGS. 3A-3C, 4A, and 4B has the characteristic that two or more nozzles among the at least four nozzles can be deactivated in each of the at least one wet processing step. An automated program for the exemplary wet chemical processing tool can include wet processing steps in which two or more of the processing-step vortex flow patterns of FIGS. 3A-3C, 4A, and 4B are employed. The set of two deactivated nozzles is different for each processing-step vortex flow patterns illustrated in FIGS. 3A-3C, 4A, and 4B.

In one embodiment, the wet chemical processing tool of the present disclosure can be a wet etch tool configured to provide an etchant solution as the liquid. In this case, a wet etch process can be performed employing the wet etch chemical processing tool of the present disclosure. For example, the at least one substrate 10 can include a plurality of semiconductor wafers of a same diameter, and the wet etch process can include an etchant such a hydrofluoric acid, phosphoric acid, isopropyl alcohol, deionized water, or any of the chemicals that are employed for semiconductor processing.

By changing the processing-step vortex flow patterns during different steps of the wet chemical treatment process, overall uniformity of the wet chemical treatment process can be enhanced. If the wet chemical treatment process is a wet etch process, the overall etch rate of the wet etch process can be more uniform by changing among the multiple processing-step vortex flow patterns. Further, if the wet etch process is a type that deposits a residual material at a stationary flow location (a location where the flow of the etchant is stationary), performing multiple processing-step vortex flow patterns that have different stationary flow locations can prevent or reduce formation of the residual material. For example, in a wet etch process employing hot phosphoric acid to etch silicon nitride, silicon oxide can be deposited at, or near, locations of each substrate 10 that are proximal to the stationary flow locations. If multiple processing-step vortex flow patterns and the wet chemical processing tool of the present disclosure are employed for a wet etch process employing hot phosphoric acid, accumulation of silicon oxide at stationary points is interrupted and discontinued at the end of each wet processing step. Thus, accumulation of silicon oxide is prevented or significantly mitigated through use of the different processing-step vortex patterns.

In one embodiment, the wet chemical processing tool of the present disclosure can be configured to extract excess amount of the liquid from the container 6 by overflow of the liquid over a rim of the container 6 as illustrated in FIGS. 2A-2F, 3A-3C, 4A, and 4B. The overflow may occur at one location having a lowest upper edge or at a location at which the liquid swells up to the highest level in each of the processing-step vortex flow patterns. Alternatively, the overflow may occur at multiple locations. The liquid that exits the container 6 through the overflow can be collected and recycled, for example, by filtering and concentration compensation, and can be re-supplied to the flow controller 100 for reuse.

Figure 5A:
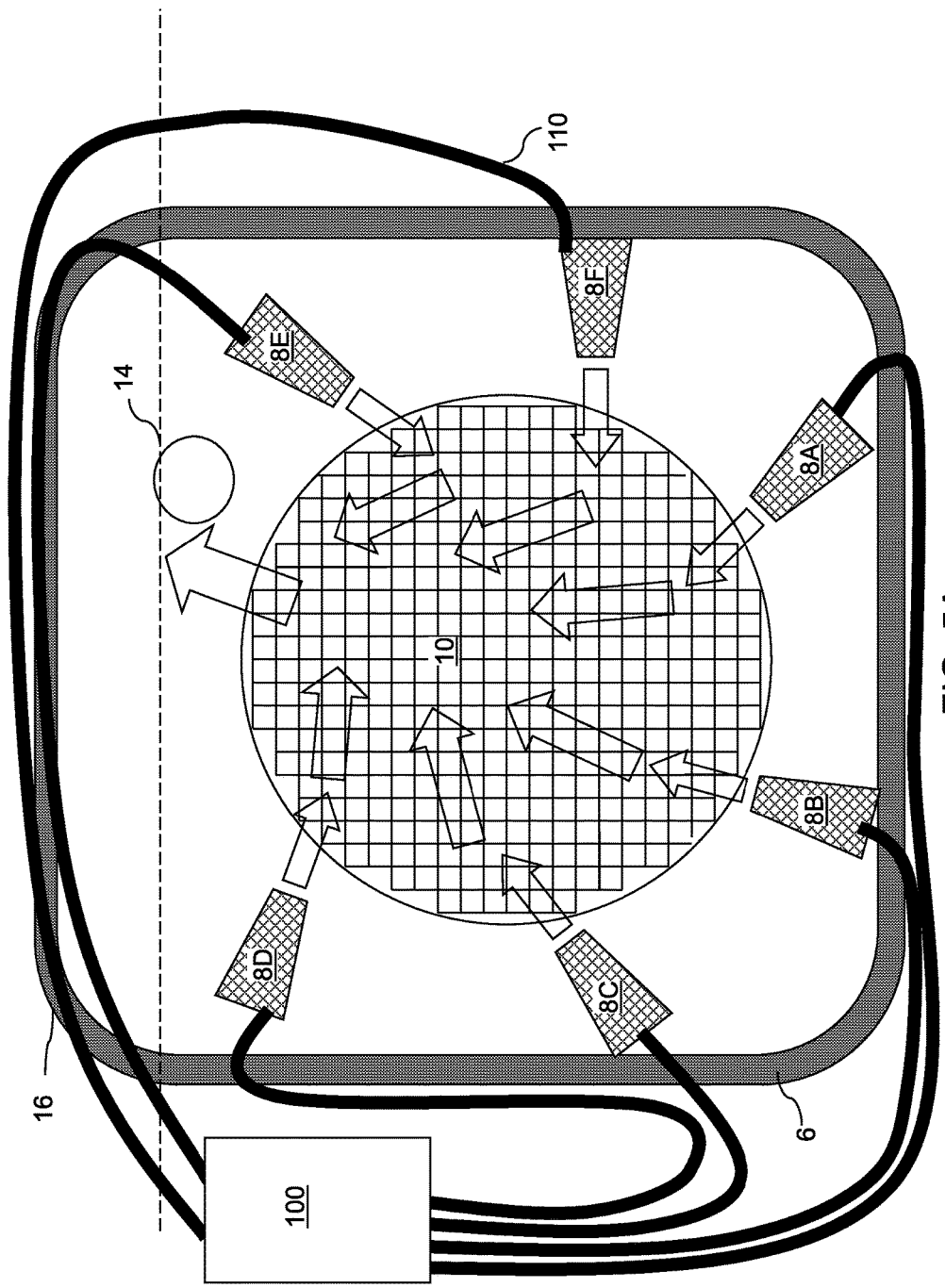
FIG. 5A is a schematic vertical cross-sectional view of a first alternative embodiment of the exemplary wet chemical processing tool during operation while all nozzles are activated with schematic illustrations of liquid supply tubes and general liquid flow directions.
Figure 5B:
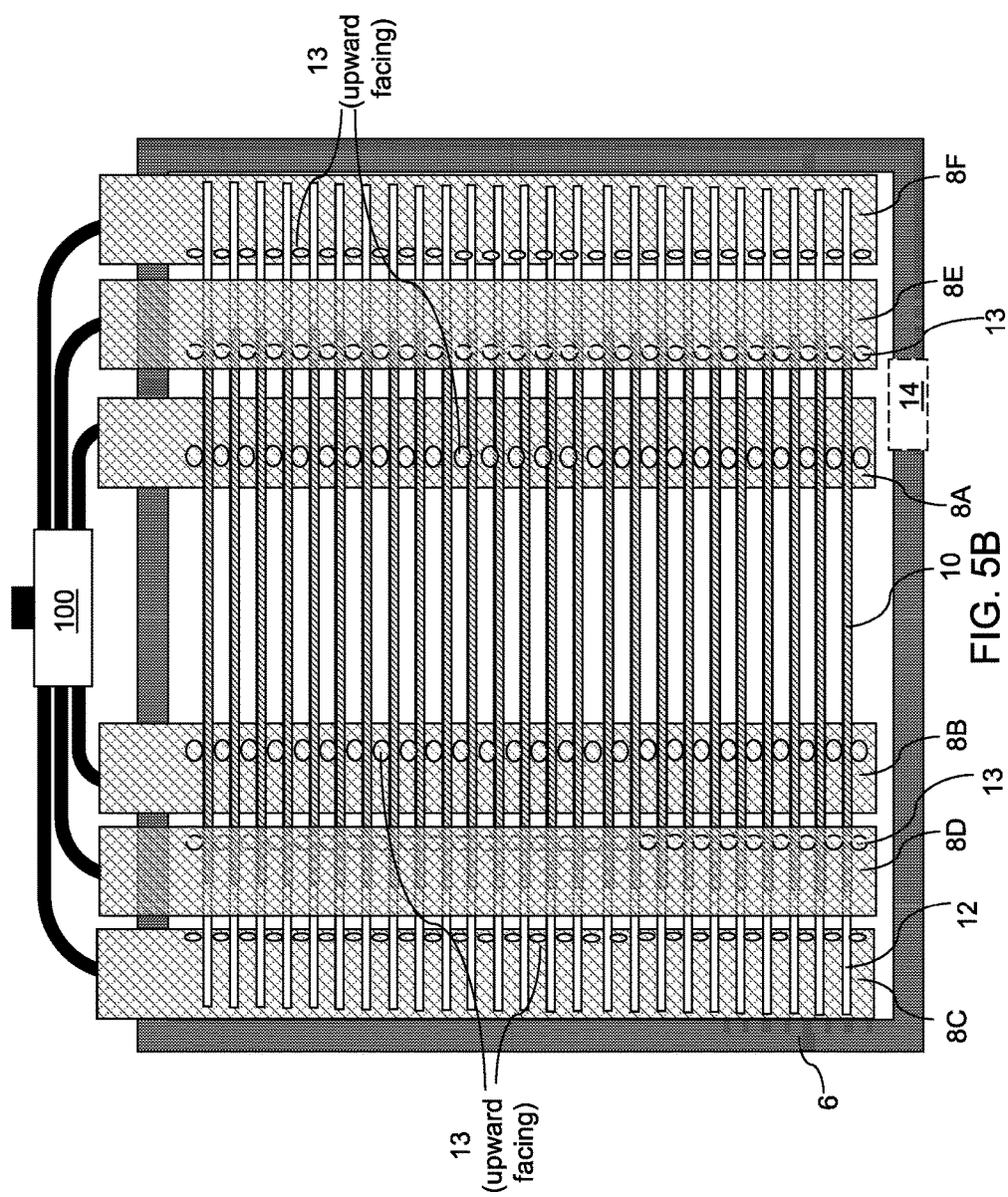
FIG. 5B is a top-down view of the first alternative embodiment of the exemplary wet chemical processing tool of FIG. 5A.

Alternatively or additionally, the wet chemical processing tool of the present disclosure can be configured to extract excess amount of the liquid from the container 6 by overflow of the liquid by extraction through a port 14 on a sidewall of the container 6. FIGS. 5A and 5B illustrate a first alternative embodiment of the exemplary wet chemical processing tool during operation while all nozzles (8A-8F) are activated. General liquid flow directions are illustrated by arrows. In this embodiment, the container 6 can contain a lid 16.

The flow pattern of FIGS. 5A and 5B can be modified by de-actuating at least one nozzle (8A-8F) in the manner illustrated in FIG. 2A-2F, 3A-3C, 4A, or 4B.

In one embodiment, the volume of the container 6 can be configured to contain a plurality of substrates 10 in a configuration in which major surfaces of the plurality of substrates 10 are parallel among one another, and are perpendicular to a horizontal direction (which is the direction of the surface normal of each of the plurality of substrates 10). The horizontal direction is herein referred to as an axial direction. The axial direction is generally parallel to the curl of the vector field that represents the velocity of the injected liquid in each of the at least two processing-step vortex flow patterns. In one embodiment, each of the at least three nozzles are oriented to provide a respective direction of injection that is perpendicular to the axial direction (i.e., the horizontal direction that is parallel to the surface normals of the major surfaces of the plurality of substrates 10).

The number of substrates 10 that can be accommodated within the container 6 can be in a range from 1-100, such as from 3-50 and/or from 5-25. While the present disclosure is described employing embodiment in which six nozzles (8A-8F) are employed for a wet chemical processing tool, one, two, or three of the nozzles (8A-8F) of any of the exemplary wet chemical processing tools described above can be removed provided that at least two processing-step vortex flow patterns can be provided after removal of the one, two, or three nozzles (8A-8F).

The wet chemical processing tool of the present disclosure can be employed to treat at least one substrate 10 with a wet chemical. At least one substrate 10 can be loaded into the wet chemical processing tool of the present disclosure, which includes an assembly of a container 6 and at least three nozzles (8A-8F). As discussed above, the container 6 includes a volume configured to contain at least one substrate 10 therein. Each of the at least three nozzles (8A-8F) is configured to inject a liquid therefrom toward a respective peripheral portion of the volume to induce a respective single-injection vortex flow pattern in the absence of injection of liquid from any other nozzle of the wet chemical processing tool. A plurality of wet processing steps can be performed by running an automated program on the at least one substrate 10. At least one of the plurality of wet processing steps generates a processing-step vortex flow pattern by de-actuating flow of the liquid from a respective set of at least one deactivated nozzle selected from the at least three nozzles while actuating each of the at least three nozzles that does not belong to the set of at least one deactivated nozzle.

In one embodiment, each of at least two of the plurality of wet processing steps generate a respective unique processing-step vortex flow pattern. Each set of at least one deactivated nozzle (8A-8F) can be different for each of the at least two of the plurality of wet processing steps.

In one embodiment, at least two of the plurality of wet processing steps generate a respective unique processing-step vortex flow pattern by de-actuating flow of the liquid from a respective set of at least one deactivated nozzle selected from the at least three nozzles (8A-8F) while actuating each of the at least three nozzles that does not belong to the set of at least one deactivated nozzle (8A-8F). Each set of at least one deactivated nozzle is different for each of the plurality of wet processing steps. Thus, different processing-step vortex flow patterns can be employed among different processing steps of the same wet chemical treatment process.

In one embodiment, at least one of the plurality of wet processing steps can include at least one wet processing step in which two or more nozzles among the at least three nozzles (8A-8F) are actuated. Non-limiting examples of this type of operational modes are illustrated in FIGS. 2A-2F, 3A-3C, 4A, and 4B. Further, this type of operational modes can be employed for configurations in which the total number of nozzles is three, four, five, or more than six.

In one embodiment, only a respective single nozzle among the at least three nozzles (8A-8C) is deactivated while all other nozzles among the at least three nozzles are activated in each wet processing step among the plurality of wet processing steps. The respective deactivated single nozzle can be different for each wet processing step among the plurality of wet processing steps. Non-limiting examples of this type of operational modes are illustrated in FIGS. 2A-2F. An automated program may include one, two, three, four, five, or six of the operational modes of FIGS. 2A-2F.

Further, this type of operational modes can be employed for configurations in which the total number of nozzles is three, four, five, or more than six.

In one embodiment, the at least three nozzles (8A-8C) can comprise at least four nozzles, and two or more nozzles among the at least four nozzles can be deactivated in each of the at least one wet processing step. Non-limiting examples of this type of operational modes are illustrated in FIGS. 3A-3C, 4A, and 4B. An automated program may include plural operational modes of these figures. Further, this type of operational modes can be employed for configurations in which the total number of nozzles is five, or more than six.

In one embodiment, the at least three nozzles comprise at least five nozzles. A respective set of two nozzles among the at least five nozzles is activated while all nozzles other than the respective set of two nozzles are deactivated in each wet processing step among the plurality of wet processing steps. The respective set of two nozzles is different for each wet processing step among the plurality of wet processing steps. Non-limiting examples of this type of operational modes are illustrated in FIGS. 3A-3C. An automated program may include plural operational modes of these figures. Further, this type of operational modes can be employed for configurations in which the total number of nozzles more than six.

In one embodiment, excess amount of the liquid can be extracted from the container 6 by overflow of the liquid over a rim of the container 6 or by extraction through a port 14 on a sidewall of the container 6.

In one embodiment, the wet chemical can be an etchant solution that etches a material on the at least one substrate. For example, the etchant solution can be hot phosphoric acid (i.e., phosphoric acid heated above room temperature) which is used to etch silicon nitride. In one embodiment, the silicon nitride may be silicon nitride sacrificial layers located in an alternating stack of silicon nitride and silicon oxide layers. The hot phosphoric acid may be used to selectively etch away the silicon nitride layers to leave recesses between the silicon oxide layers in the stack. The recesses can be filled with electrically conductive electrodes, such as tungsten word lines to form word lines of a three dimensional (e.g., vertical) NAND memory device. The NAND memory device also includes a vertical channel and a memory film which vertically extend through the alternating stack of silicon oxide layers and word lines. The memory film includes a blocking dielectric, a charge storage layer (e.g., silicon nitride) and a tunneling dielectric, as described in U.S. Pat. No. 9,570,455, which is incorporated herein by reference in its entirety.

In one embodiment, loading the at least one substrate 10 can comprise loading a plurality of substrates 10 in a configuration in which major surfaces of the plurality of substrates 10 are parallel among one another, and are perpendicular to a horizontal direction, which can be the axial direction of the processing-step vortex flow patterns. In one embodiment, each of the at least three nozzles (8A-8C) provides a respective direction of injection that is perpendicular to the horizontal direction, i.e., the axial direction.

Thus, in some embodiments, the method of using the wet processing tool includes loading at least one substrate 10 into a wet chemical processing tool including an assembly of a container 6 and nozzles (8A-8F), activating a first set of the nozzles to inject a liquid from the first set of nozzles toward the at least one substrate to induce a first vortex flow pattern while at least one remaining first nozzle is deactivated, and activating a second set of the nozzles different from the first set of nozzles to inject the liquid from the second set of nozzles toward the at least one substrate to induce a second vortex flow pattern different from the first vortex flow pattern while at least one remaining second nozzle different from the first nozzle is deactivated.

In one embodiment, the first set of nozzles includes at least two nozzles (e.g., 8A and 8D, as shown in FIG. 3A), and the second set of nozzles includes at least two nozzles (e.g., 8B and 8E, as shown in FIG. 3B) such that at least one nozzle (e.g., 8A) in the first set of nozzles is not present in the second set of nozzles. In this embodiment, at least one remaining first nozzle (e.g., 8B, 8C, 8E and/or 8F) is deactivated during the step of activating a first set of the nozzles as shown in FIG. 3A. At least one remaining second nozzle (e.g., 8A, 8C, 8D and/or 8F) is deactivated during the step of activating a first set of the nozzles as shown in FIG. 3B.

In another embodiment shown in FIGS. 2A-2F, only one remaining first nozzle is deactivated during the step of activating the first set of the nozzles, and only one remaining second nozzle is deactivated during the step of activating the second set of the nozzles.

In the embodiments shown in FIGS. 3A-3C and 4A-4B, at least two, such as at least three remaining first nozzles are deactivated during the step of activating the first set of the nozzles, and at least two, such as at least three remaining second nozzles are deactivated during the step of activating the second set of the nozzles. In the embodiment shown in FIGS. 4A and 4B, the step of activating the first set of the nozzles comprises activating three nozzles (as shown in FIG. 4A), and the step of activating the second set of the nozzles comprises activating three different nozzles (as shown in FIG. 4B).

As described above, in one embodiment, the wet chemical processing tool is a wet etch tool, the liquid comprises an etchant solution which etches at least one layer located over the at least one substrate, the at least one substrate comprises substantially circular semiconductor wafers, and the nozzles are positioned off-center from a geometrical center of the at least one substrate such that injection of the liquid from any single nozzle induces a rotating flow pattern, as shown in FIG. 1A. For example, the etchant solution can be hot phosphoric acid which etches at least one silicon nitride layer located over the at least one substrate 10.

In one embodiment shown in FIGS. 3A-3C and 4A-4C, a flow rate of the liquid from one nozzle in the first set is greater than a flow rate of the liquid from another nozzle in the first set during the step of activating a first set of the nozzles.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of treating at least one substrate with a wet chemical, comprising:

loading at least one substrate into a confined volume of a container of a wet chemical processing tool, which includes an assembly of the container and nozzles, wherein each of the nozzles is connected to different liquid supply tubes and has a respective direction of injection that is off-center from a geometrical center of the confined volume of the container to induce a respective single-injection vortex flow pattern within the confined volume of the container upon injection of a respective liquid therefrom into the confined volume;

activating a first set of the nozzles to inject a liquid from the first set of nozzles toward the at least one substrate to induce a first vortex flow pattern while at least one remaining first nozzle is deactivated and while the at least one substrate and the nozzles are entirely immersed within the liquid in the confined volume; and activating a second set of the nozzles different from the first set of nozzles to inject the liquid from the second set of nozzles toward the at least one substrate to induce a second vortex flow pattern different from the first vortex flow pattern while at least one remaining second nozzle different from the first nozzle is deactivated and while the at least one substrate and the nozzles are entirely immersed within the liquid in the confined volume.

2. The method of claim 1, wherein a flow rate of the liquid from one nozzle in the first set is greater than a flow rate of the liquid from another nozzle in the first set during the step of activating a first set of the nozzles.

3. The method of claim 1, wherein:
the wet chemical processing tool is a wet etch tool;
the liquid comprises an etchant solution which etches at least one layer located over the at least one substrate;
the at least one substrate comprises substantially circular semiconductor wafers; and
the nozzles are positioned off-center from a geometrical center of the at least one substrate such that injection of the liquid from any single nozzle induces a rotating flow pattern.

4. The method of claim 3, wherein the etchant solution comprises phosphoric acid which etches at least one silicon nitride layer located over the at least one substrate.

5. The method of claim 1, wherein the first set of nozzles includes at least two nozzles and the second set of nozzles includes at least two nozzles such that at least one nozzle in the first set of nozzles is not present in the second set of nozzles.

6. The method of claim 5, wherein only one remaining first nozzle is deactivated during the step of activating the first set of the nozzles, and wherein only one remaining second nozzle is deactivated during the step of activating the second set of the nozzles.

7. The method of claim 5, wherein at least two remaining first nozzles are deactivated during the step of activating the first set of the nozzles, and wherein at least two remaining second nozzles are deactivated during the step of activating the second set of the nozzles.

8. The method of claim 5, wherein at least three remaining first nozzles are deactivated during the step of activating the first set of the nozzles, and wherein at least three remaining second nozzles are deactivated during the step of activating the second set of the nozzles.

9. The method of claim 8, wherein the step of activating the first set of the nozzles comprises activating three nozzles, and wherein the step of activating the second set of the nozzles comprises activating three different nozzles.

10. The method of claim 1, wherein:
the nozzles comprise at least three nozzles; and
each of the single-injection vortex flow pattern has a same rotation direction with respect to an axis that passes through a geometrical center of the at least one substrate and that is perpendicular to major surfaces of the at least one substrate.

11. The method of claim 10, wherein the at least three nozzles are positioned at different rotational angles around the axis.

12. The method of claim 10, wherein the at least one substrate comprises a plurality of substrates, and each single-injection vortex flow pattern includes a flow path between neighboring pairs of substrates among the plurality of substrates.

13. The method of claim 10, wherein the container comprises a support configured to support a plurality of substrates in a configuration in which major surfaces of the plurality of substrates are parallel among one another and are perpendicular to the axis.

14. The method of claim 13, wherein:
the at least one substrate comprises a plurality of substrates; and
the method comprises holding the plurality of substrates with an inter-substrate pitch, wherein each of the at least three nozzles comprises a respective array of outlets in a respective pipe arranged along a direction of the inter-substrate pitch and having an inter-outlet pitch that is the same as the inter-substrate pitch; and
and the method comprises injecting the liquid between neighboring pairs of substrates among the plurality of substrates.

15. The method of claim 10, further comprising actuating and de-actuating flow of the liquid through each of the at least three nozzles in a plurality of wet processing steps, wherein at least one of the plurality of wet processing steps generates a processing-step vortex flow pattern by de-actuating flow of the liquid from a respective set of at least one deactivated nozzle selected from the at least three nozzles while actuating each of the at least three nozzles that does not belong to the set of at least one deactivated nozzle.

16. The method of claim 15, wherein the at least one of the plurality of wet processing steps includes at least one wet processing step in which two or more nozzles among the at least three nozzles are actuated.

17. The method of claim 15, wherein:
each of at least two of the plurality of wet processing steps generates a respective unique processing-step vortex flow pattern; and
each set of at least one deactivated nozzle is different for each of the at least two of the plurality of wet processing steps.

18. The method of claim 15, wherein only a respective single nozzle among the at least three nozzles is deactivated while all other nozzles among the at least three nozzles are activated in each wet processing step among the plurality of wet processing steps, wherein the respective deactivated single nozzle is different for each wet processing step among the at least two of the plurality of wet processing steps.

19. The method of claim 18, wherein:
the at least three nozzles comprise at least four nozzles; and
two or more nozzles among the at least four nozzles are deactivated in each of the at least one wet processing step.

20. The method of claim 18, wherein:
the at least three nozzles comprise at least five nozzles; and
a respective set of two nozzles among the at least five nozzles is activated while all nozzles other than the respective set of two nozzles are deactivated in each wet processing step among the plurality of wet processing steps, wherein the respective set of two nozzles is different for each wet processing step among the at least two of the plurality of wet processing steps.

* * * * *